(12) United States Patent
Cao et al.

(10) Patent No.: US 12,068,160 B2
(45) Date of Patent: Aug. 20, 2024

(54) METHOD FOR MANUFACTURING SEMICONDUCTOR STRUCTURE

(71) Applicant: CHANGXIN MEMORY TECHNOLOGIES, INC., Hefei (CN)

(72) Inventors: Xinman Cao, Hefei (CN); Zhongming Liu, Hefei (CN); Shijie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 406 days.

(21) Appl. No.: 17/468,909

(22) Filed: Sep. 8, 2021

(65) Prior Publication Data

US 2022/0270879 A1 Aug. 25, 2022

Related U.S. Application Data

(63) Continuation of application No. PCT/CN2021/105237, filed on Jul. 8, 2021.

(30) Foreign Application Priority Data

Feb. 23, 2021 (CN) .......................... 202110200823.9

(51) Int. Cl.
*H01L 21/033* (2006.01)
*H01L 21/311* (2006.01)
*H01L 49/02* (2006.01)

(52) U.S. Cl.
CPC .......... *H01L 21/0337* (2013.01); *H01L 28/60* (2013.01); *H01L 21/0332* (2013.01); *H01L 21/31144* (2013.01)

(58) Field of Classification Search
CPC ............. H01L 21/0337; H01L 21/0332; H01L 21/31144; H01L 28/60; H01L 28/90; H10B 12/033
See application file for complete search history.

(56) References Cited

U.S. PATENT DOCUMENTS 5,814,563 A * 9/1998 Ding ................. H01L 21/31116 257/E21.252
6,831,007 B2 * 12/2004 Kim .................. H01L 21/32139 438/720

(Continued)

FOREIGN PATENT DOCUMENTS

CN 100547731 C 10/2009
CN 109216168 A 1/2019

(Continued)

*Primary Examiner* — Dale E Page
*Assistant Examiner* — Quovaunda Jefferson
(74) *Attorney, Agent, or Firm* — Kilpatrick Townsend & Stockton LLP

(57) ABSTRACT

A method for manufacturing a semiconductor structure, comprising: forming a first mask layer, a first buffer layer, a second mask layer and a second buffer layer sequentially stacked from bottom to top; patterning the second buffer layer and the second mask layer; forming a first mask pattern on a side wall of a first pattern, the first mask pattern extending in a first direction; removing the second buffer layer and the second mask layer; forming a third mask layer, a third buffer layer, a fourth mask layer and a fourth buffer layer sequentially stacked form bottom to top; patterning the fourth buffer layer and the fourth mask layer; forming a second mask pattern on a side wall of a second pattern, the second mask pattern extending in a second direction; removing the fourth buffer layer and the fourth mask layer.

19 Claims, 20 Drawing Sheets

(56) References Cited

U.S. PATENT DOCUMENTS

| | | |
|---|---|---|
| 10,312,088 B1 | 6/2019 | Chang et al. |
| 2003/0087514 A1 | 5/2003 | Tang |
| 2005/0059234 A1 | 3/2005 | Bera |
| 2007/0026665 A1 | 2/2007 | Bera |
| 2020/0219732 A1* | 7/2020 | Lee .................... H01L 21/0337 |

FOREIGN PATENT DOCUMENTS

| | | | | |
|---|---|---|---|---|
| CN | 208637425 U | | 3/2019 | |
| CN | 110690197 A | | 1/2020 | |
| CN | 110808318 A | | 2/2020 | |
| CN | 110931423 A | | 3/2020 | |
| CN | 112133625 A | * | 12/2020 | ........... H01L 21/027 |
| CN | 112133625 A | | 12/2020 | |
| CN | 113013030 A | | 6/2021 | |

\* cited by examiner

METHOD FOR MANUFACTURING SEMICONDUCTOR STRUCTURE

CROSS-REFERENCE TO RELATED APPLICATIONS

This is a continuation application of International Patent Application No. PCT/CN2021/105237, filed on Jul. 8, 2021, which claims priority to Chinese patent application No. 202110200823.9, filed on Feb. 23, 2021 and entitled "METHOD FOR MANUFACTURING SEMICONDUCTOR STRUCTURE", the disclosure of which is hereby incorporated by reference in their entireties.

TECHNICAL FIELD

The present disclosure relates to the technical field of an integrated circuit, and more particular, to a method for manufacturing a semiconductor structure.

BACKGROUND

With the development of the semiconductor technology, two layers of mask patterns usually need to be formed in an existing semiconductor structure. The two layers of the mask patterns include grooves which are arranged at intervals. Seen from a top view, the two layers of the mask patterns are obliquely crossed with each other. The two layers of the mask patterns are transferred onto a target mask layer so as to define a pattern of an etching hole in a to-be-etched material.

However, a lower layer material is easily etched while the mask patterns are formed, so that holes formed by crossing the two layers of the mask patterns on the target mask layer are uneven in dimension after the two layers of the mask patterns are transferred onto the target mask layer. While the to-be-etched material is etched according to the target mask layer, each etching hole in the to-be-etched material is inconsistent in dimension, thereby influencing the performance of device.

SUMMARY

According to some embodiments, a method for manufacturing a semiconductor structure is provided.

The method for manufacturing the semiconductor structure includes the following operations.

A first mask layer, a first buffer layer, a second mask layer and a second buffer layer sequentially stacked from bottom to top are formed, and an etching selectivity of the second buffer layer to the first buffer layer is greater than 1.

The second buffer layer and the second mask layer are patterned to form a first pattern.

A first mask pattern is formed on a side wall of the first pattern, and the first mask pattern extends in a first direction.

The second buffer layer and the second mask layer are removed.

A third mask layer, a third buffer layer, a fourth mask layer and a fourth buffer layer sequentially stacked form bottom to top are formed, the third mask layer covers the first buffer layer and fills up gaps between first mask patterns, an upper surface of the third mask layer is flush with an upper surface of the first mask pattern, and an etching selectivity of the fourth buffer layer to the third buffer layer is greater than 1.

The fourth buffer layer and the fourth mask layer are patterned to form a second pattern.

A second mask pattern is formed on a side wall of the second pattern, the second mask pattern extends in a second direction, and the second direction is obliquely crossed with the first direction.

The fourth buffer layer and the fourth mask layer are removed.

According to the method for manufacturing the semiconductor structure of the present disclosure, by setting the etching selectivity of the second buffer layer to the first buffer layer to be greater than 1, the first buffer layer may be protected from being etched while the first mask pattern is formed. By setting the etching selectivity of the fourth buffer layer to the third buffer layer to be greater than 1, the third buffer layer is protected from being etched while the second mask pattern is formed. In such a manner, the holes formed by obliquely crossing the two patterns are uniform in dimension after the first mask pattern and the second mask pattern are transferred onto the target mask layer, and each etching hole formed by etching the to-be-etched material with the target mask layer are also consistent in dimension, thereby not influencing the performance of device.

BRIEF DESCRIPTION OF THE DRAWINGS

In order to describe the technical solutions in the embodiments of the present disclosure or the conventional art more clearly, the drawings needed to be used in the embodiments or the conventional art will be briefly introduced below. Apparently, the drawings in the following description are merely some embodiments of the present disclosure. Those of ordinary skill in the art may further obtain other drawings according to these drawings without creative work.

DETAILED DESCRIPTION

Figure 1A:
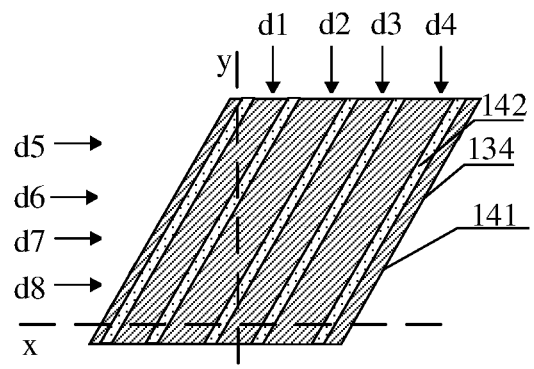
FIG. 1A to FIG. 1C are respectively a top view, a cross-sectional view in an X direction and a cross-sectional view in a Y direction after two layers of mask patterns are formed in a conventional method for manufacturing a semiconductor structure.

To facilitate understanding of the present disclosure, the present disclosure will be described more comprehensively below with reference to the related accompanying drawings. Preferred embodiments of the present disclosure are given in the accompanying drawings. However, the present disclosure may be embodied in many different forms and should not be limited to the embodiments set forth herein. Rather, these embodiments are provided to make the content of the present disclosure be more thorough and complete.

Unless defined otherwise, all technical and scientific terms used herein have the same meaning as commonly understood by those of ordinary skill in the art to which the present disclosure belongs. The terms used herein in the specification of the present disclosure are for the purpose of describing specific embodiments only and are not intended to limit the present disclosure.

It is to be understood that when an element or a layer is referred to as being "on", "adjacent to", "connected to" or "coupled to" other elements or layers, it may be directly on, adjacent to, connected to or coupled to the other elements or layers, or an intervening element or layer may be present. Rather, when an element is referred to as being "directly on", "directly adjacent to", "directly connected to" or "directly coupled to" other elements or layers, an intervening element or layer is absent. It is to be understood that although the terms first, second, third, and the like may be used to describe various elements, components, regions, layers, doping types, and/or portions, these elements, components, regions, layers, doping types, and/or portions should not be limited by these terms. These terms are merely used to distinguish one element, component, region, layer, doping type, or portion from another element, component, region, layer, doping type, or portion. Therefore, a first element, component, region, layer, doping type, or portion discussed below may be represented as a second element, component, region, layer, or portion without departing from the teachings of the present disclosure. For example, a first doping type may be a second doping type, and similarly, the second doping type may be the first doping type. The first doping type and the second doping type are different doping types, for example, the first doping type may be P-type and the second doping type may be N-type, or the first doping type may be N-type and the second doping type may be P-type.

Spatial relation terms such as "under", "underneath", "lower", "below", "above", "upper", and the like, may be used herein to describe a relation between one element or feature and other elements or features as illustrated in the figures. It is to be understood that in addition to the orientation shown in the figures, the spatial relation terms further include different orientations of a device in use and operation. For example, if the device in the figures is turned over, the element or feature described as "underneath the other element" or "below it" or "under it" will be oriented "over" the other element or feature. Therefore, the exemplary terms "under" and "below" may include both upper and lower orientations. In addition, the device may also include additional orientations (for example, rotated 90 degrees or other orientations), and the spatial descriptors used herein are interpreted accordingly.

As used herein, the singular forms "a", "an", and said/the" may include the plural forms as well, unless the context clearly indicates otherwise. It is also to be understood that when the terms "constituting" and/or "comprising" are used in the specification, the presence of the feature, integer, step, operation, element, and/or component may be determined, but the presence or addition of one or more other features, integers, steps, operations, elements, components and/or groups is not precluded. Meanwhile, the term "and/or" used herein includes any and all combinations of the associated listed items.

The embodiments of the present disclosure are described herein with reference to cross-sectional views that are used as schematic diagrams of ideal embodiments (and intervening structures) of the present disclosure, so that changes in shape caused by, for example, a manufacturing technique and/or a tolerance may be expected. Therefore, the embodiments of the present disclosure should not be limited to specific shapes of regions shown herein but include shape deviations caused by, for example, the manufacturing technique. For example, an injection region shown as a rectangle typically has a circular or curved feature and/or injection concentration gradient at an edge thereof, rather than a binary change from the injection region to a non-injection region. Likewise, a burial region formed through injection may result in some injection in a region between the burial region and a surface through which the injection is performed. Therefore, the regions shown in the figures are substantially schematic, and shapes thereof neither represent actual shapes of the regions of the device nor limit the scope of the present disclosure.

Figure 1B:
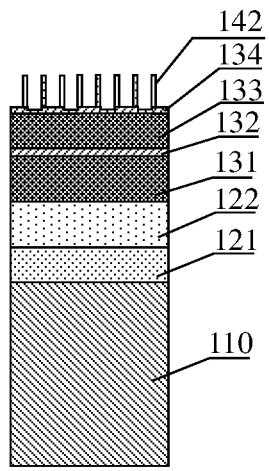
Figure 1C:
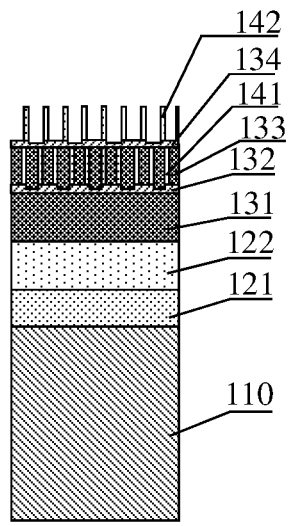
Figure 2A:
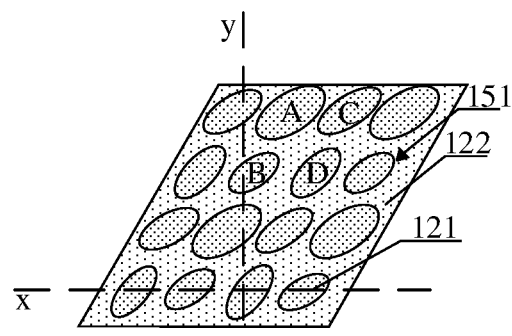
FIG. 2A to FIG. 2C are respectively a top view, a cross-sectional view in an X direction and a cross-sectional view in a Y direction after two layers of mask patterns are transferred onto a second mask layer in a conventional method for manufacturing a semiconductor structure.
Figure 2B:
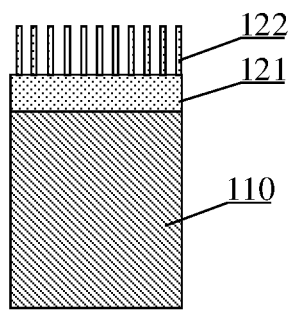
Figure 2C:
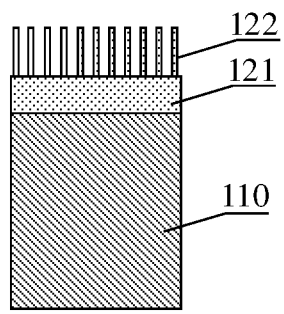
Figure 3A:
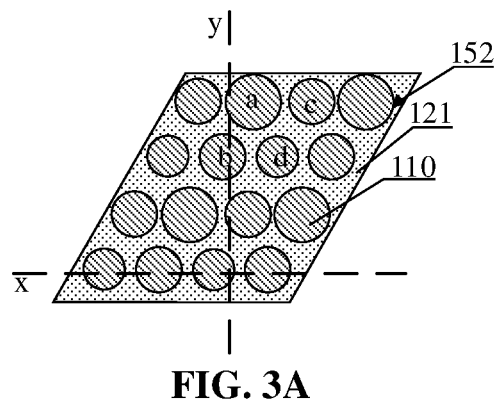
FIG. 3A to FIG. 3C are respectively a top view, a cross-sectional view in an X direction and a cross-sectional view in a Y direction after two layers of mask patterns are transferred onto a first target mask layer in a conventional method for manufacturing a semiconductor structure.
Figure 3B:
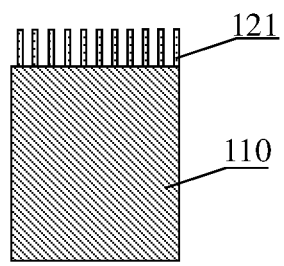
Figure 3C:
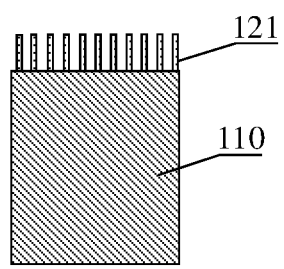
Figure 4A:
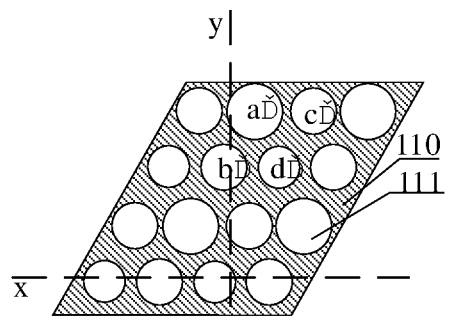
FIG. 4A to FIG. 4C are respectively a top view, a cross-sectional view in an X direction and a cross-sectional view in a Y direction after a to-be-etched material is etched in a conventional method for manufacturing a semiconductor structure.
Figure 4B:
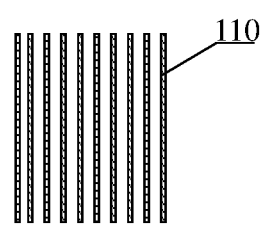
Figure 4C:
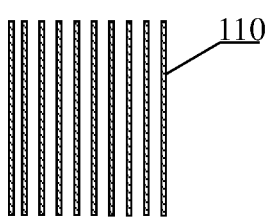

The top view of FIG. 1A shows a first mask pattern 141, but the first mask pattern 141 cannot be seen from the top view actually. FIG. 1B is a cross-sectional view in an x direction in FIG. 1A, and FIG. 1C is a cross-sectional view in a y direction in FIG. 1A. FIG. 2B is a cross-sectional view in an x direction in FIG. 2A, and FIG. 2C is a cross-sectional view in a y direction in FIG. 2A. FIG. 3B is a cross-sectional view in an x direction in FIG. 3A, and FIG. 3C is a cross-sectional view in a y direction in FIG. 3A. FIG. 4B is a cross-sectional view in an x direction in FIG. 4A, and FIG. 4C is a cross-sectional view in a y direction in FIG. 4A. The x direction may be a direction perpendicular to the y direction. Referring to FIG. 1A to FIG. 4C, in the conventional art, a to-be-etched material layer 110, a first target mask layer 121, a second target mask layer 122, a first mask layer 131 and a first buffer layer 132 may be stacked sequentially. Then, a first mask pattern 141 extending in a first direction (may be an x direction) is formed on the first buffer layer 132, and a second mask layer 133 covering the first buffer layer 132 and filling up gaps between first mask pattern 141 is formed. A second buffer layer 134 is formed on the first mask pattern 141 and the second mask layer 133, and a second mask pattern 142 extending in a second direction (may be a y direction or a direction between the x direction and the y direction) is formed on the second buffer layer 134.

The first mask pattern 141 may include grooves which are arranged at intervals, and the first buffer layer 132 at the lower layer is easily etched in the operation of forming the first mask pattern 141, so that grooves are formed on the first buffer layer 132. For example, a groove d2 is etched more than a groove d1, and a groove d4 is etched more than a groove d3. The second buffer layer 134 at the lower layer is easily etched in the operation of forming the second mask pattern 142, so that grooves are formed on the second buffer layer 134. A groove d5 is etched more than a groove d6, and a groove d7 is etched more than a groove d8.

When the first mask pattern 141 and the second mask pattern 142 are transferred onto the second target mask layer 122, a second target mask layer opening 151 formed on the second target mask layer 122 is uneven in dimension. For example, a dimension of a second target mask layer opening A formed at an intersection of the groove d2 and the groove d5 is greater than that of a second target mask layer opening B formed at an intersection of the groove d2 and the groove d6, a dimension of a second target mask layer opening C formed at an intersection of the groove d3 and the groove d5 is greater than that of a second target mask layer opening D formed at an intersection of the groove d3 and the groove d6. Therefore, a dimension of each first target mask layer opening 152 formed when the patterns on the second target mask layer 122 are continuously transferred onto the first target mask layer 121 is also inconsistent. When the second target mask layer opening 151 is oval, the first target mask layer opening 152 may be circular. For example, a diameter of the first target mask layer opening a is greater than that of the first target mask layer opening b, and a diameter of the first target mask layer opening c is greater than that of the first target mask layer opening d. Therefore, when the to-be-etched material layer 110 is etched according to the first target mask layer 121, a dimension of the etching hole 111 formed on the to-be-etched material 110 is inconsistent, thereby influencing the performance of a formed semiconductor device. For example, on the to-be-etched material layer 110, a diameter of an etching hole a' is greater than that of an etching hole b', and a diameter of an etching hole c' is greater than that of an etching hole d'.

Figure 5:
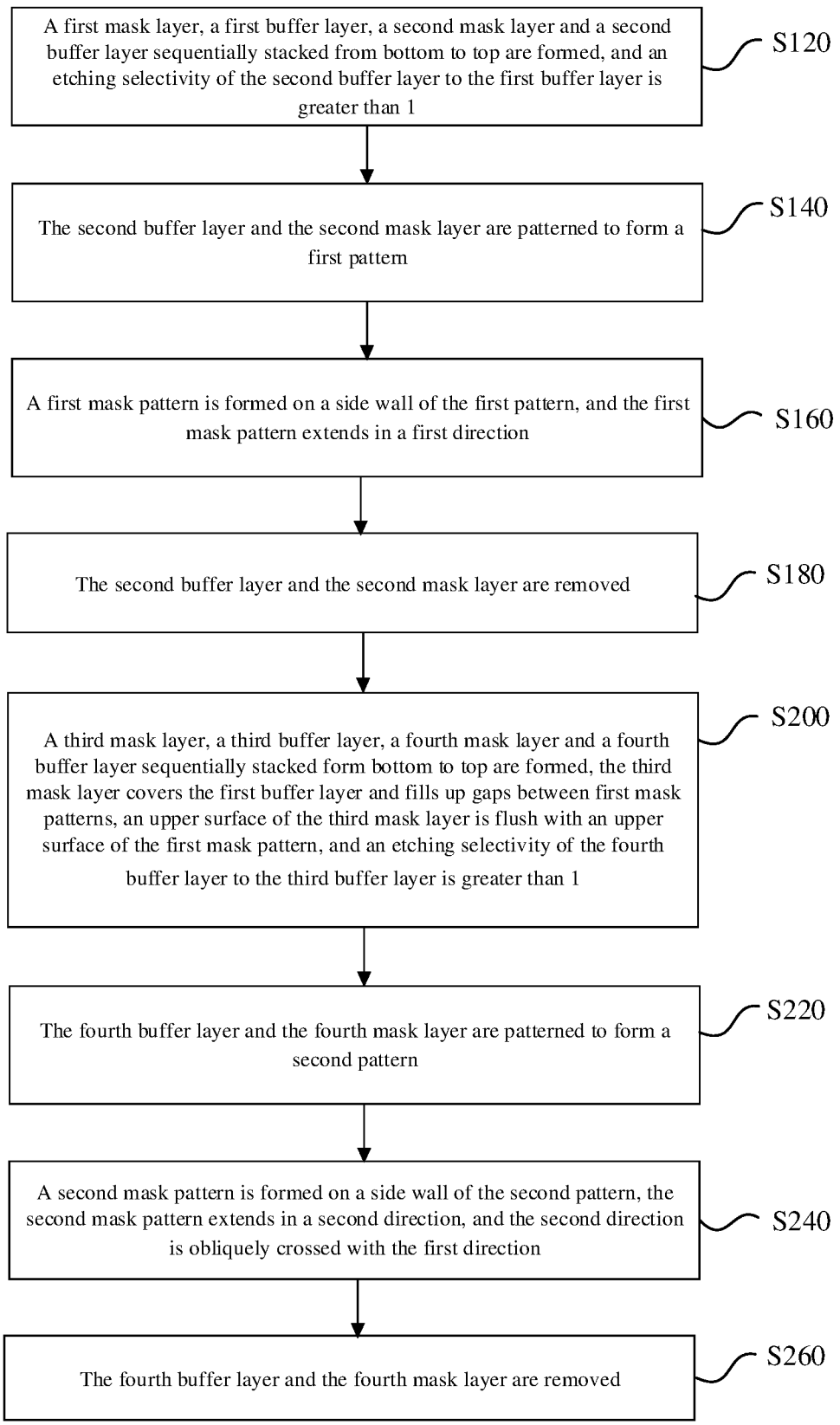
FIG. 5 is a flowchart of a method for manufacturing a semiconductor structure provided in an embodiment of the present disclosure.

Referring to FIG. 5, a method for manufacturing a semiconductor structures is provided, which includes the following operations.

In S120, a first mask layer, a first buffer layer, a second mask layer and a second buffer layer sequentially stacked from bottom to top are formed, and an etching selectivity of the second buffer layer to the first buffer layer is greater than 1.

In S140, the second buffer layer and the second mask layer are patterned to form a first pattern.

In S160, a first mask pattern is formed on a side wall of the first pattern, and the first mask pattern extends in a first direction.

In S180, the second buffer layer and the second mask layer are removed.

In S200, a third mask layer, a third buffer layer, a fourth mask layer and a fourth buffer layer sequentially stacked form bottom to top are formed, the third mask layer covers the first buffer layer and fills up gaps between first mask patterns, an upper surface of the third mask layer is flush with an upper surface of the first mask pattern, and an etching selectivity of the fourth buffer layer to the third buffer layer is greater than 1.

In S220, the fourth buffer layer and the fourth mask layer are patterned to form a second pattern.

In S240, a second mask pattern is formed on a side wall of the second pattern, the second mask pattern extends in a second direction, and the second direction is obliquely crossed with the first direction.

In S260, the fourth buffer layer and the fourth mask layer are removed.

According to the above method for manufacturing the semiconductor structure in the embodiments, by setting the etching selectivity of the second buffer layer to the first buffer layer to be greater than 1, the first buffer layer may be protected from being etched while the first mask pattern is formed. By setting the etching selectivity of the fourth buffer layer to the third buffer layer to be greater than 1, the third buffer layer is protected from being etched while the second mask pattern is formed. In such a manner, the holes formed by obliquely crossing the two patterns are uniform in dimension after the first mask pattern and the second mask pattern are transferred onto the target mask layer, and the etching holes formed by etching the to-be-etched material with the target mask layer are also consistent in dimension, thereby not influencing the performance of device.

Figure 6A:
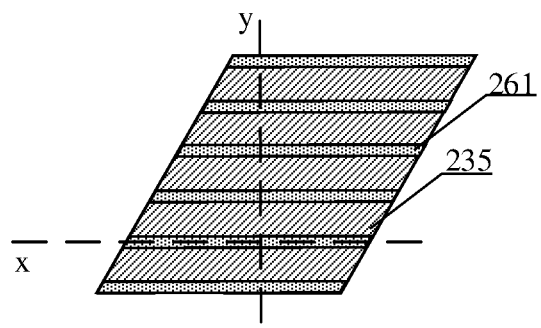
FIG. 6A to FIG. 19C are respectively a top view, a cross-sectional view in an X direction and a cross-sectional view in a Y direction of a structure obtained in each operation in a method for manufacturing a semiconductor structure provided in an embodiment of the present disclosure.
Figure 6B:
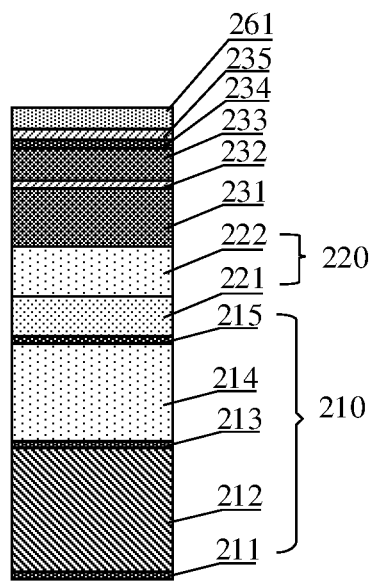
Figure 6C:
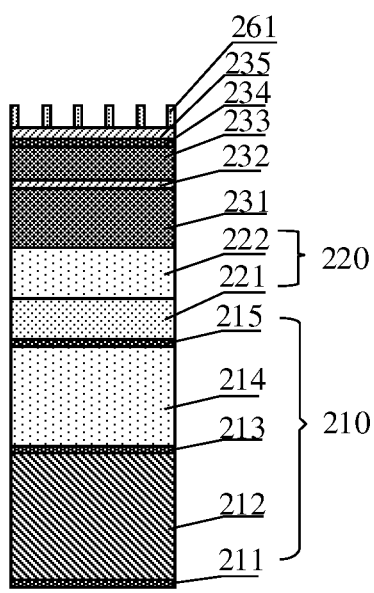

In S120, referring to the operation in S120 of FIG. 5 and FIG. 6A to FIG. 6C (FIG. 6B is a cross-sectional view in an x direction in FIG. 6A, FIG. 6C is a cross-sectional view in a y direction in FIG. 6A, and the x direction is a direction perpendicular to the y direction), a first mask layer 231, a first buffer layer 232, a second mask layer 233 and a second buffer layer 234 sequentially stacked from bottom to top are formed, and the etching selectivity of the second buffer layer 234 to the first buffer layer 232 is greater than 1.

Only illustratively, the first mask layer 231 and the second mask layer 233 may include, but are not limited to a Spin-On Hardmask (SOH). The SOH may include an amorphous carbon layer or an amorphous silicon layer. The first buffer layer 232 may include, but is not limited to a silicon oxynitride layer. The second buffer layer 234 may include, but is not limited to a silicon nitride layer or an oxide layer. The oxide layer may include a silicon oxide layer formed by tetraethyl orthosilicate. The etching selectivity of the second buffer layer 234 to the first buffer layer 232 is greater than 1, for example, the etching selectivity of the second buffer layer 234 to the first buffer layer 232 may be in the range of 10-50.

Specifically, the first mask layer 231, the first buffer layer 232, the second mask layer 233 and the second buffer layer 234 may be formed through any process known to those of skill in the art. For example, the second buffer layer 234 may be formed through depositing silicon nitride or oxide through an Atomic Layer Deposition (ALD) process.

Figure 7A:
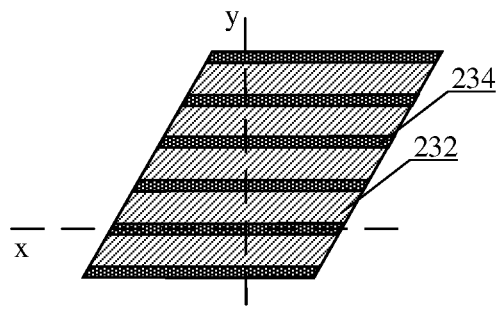
Figure 7B:
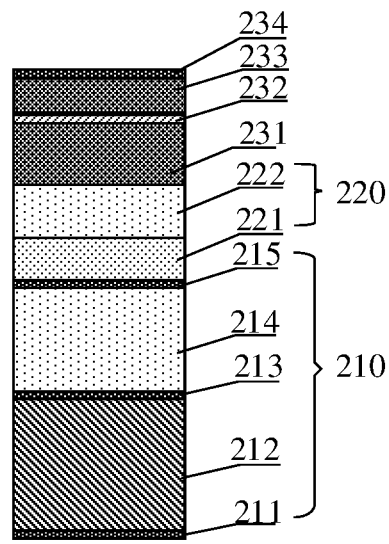
Figure 7C:
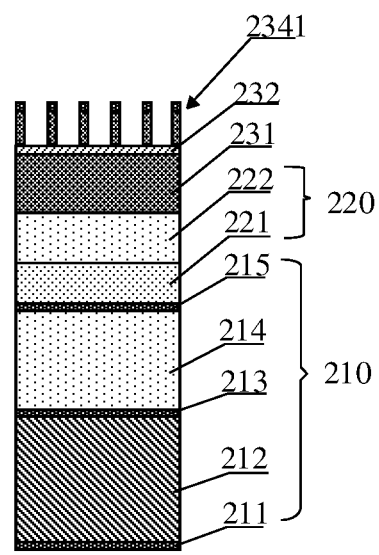

In S140, referring to the operation in S140 of FIG. 5 and FIG. 7A to FIG. 7C (FIG. 7B is a cross-sectional view in an x direction in FIG. 7A, FIG. 7C is a cross-sectional view in a y direction in FIG. 7A, and the x direction is a direction perpendicular to the y direction), the second buffer layer 234 and the second mask layer 233 are patterned to form the first pattern 2341.

Specifically, a first photoresist layer 261 may be formed on the second buffer layer 234, and the first photoresist layer 261 may be photolithographed with a mask (including, but not limited to coating, baking, exposing, developing and the like), so that a pattern extending in a first direction (the first direction in the embodiment provided in the present disclosure may be the x direction, and the second direction may be the y direction or the direction between the x direction and the y direction) is formed on the first photoresist layer 261, and the pattern on the first photoresist layer 261 may define the first pattern 2341. The pattern on the first photoresist layer 261 shown in the embodiment of FIG. 6A includes multiple long-strip-shaped patterns which are arranged in the second direction and extend in the first direction, and spacing among the long-strip-shaped patterns may be set according to practical needs. In other embodiments, the shape of the first pattern 2341 defined by the first photoresist layer 261 also may be other shapes. The second buffer layer 234 and the second mask layer 233 are sequentially etched based on the pattern on the first photoresist layer 261 to form the first pattern 2341. The first pattern 2341 also may be in a long-strip shape which is arranged in the second direction and extends in the first direction. The first photoresist layer 261 may be removed after the first pattern 2341 is formed.

In one embodiment, the operation of forming a fifth buffer layer 235 on an upper surface of the second buffer layer 234 in S130 is further included before the operation of forming the first pattern 2341 in S140, and the material of the fifth buffer layer 235 may be the same with that of the first buffer layer 232. For example, each of the first buffer layer 232 and the fifth buffer layer 235 includes, but is not limited to, a silicon oxynitride layer. The fifth buffer layer 235 may be formed through any process known to those of skill in the art.

In the embodiment, the operation of patterning the second buffer layer 234 and the second mask layer 233 to form the first pattern 2341 in S140 includes the operations in S141 to S144.

In S141, the fifth buffer layer 235 is patterned, and the first pattern 2341 is defined by a patterned fifth buffer layer 235.

In S142, the second buffer layer 234 is patterned based on the patterned fifth buffer layer 235.

In S143, the patterned fifth buffer layer 235 is removed.

In S144, the second mask layer 233 is patterned based on the patterned second buffer layer 234 to form the first pattern 2341.

Specifically, the fifth buffer layer 235 may serve as an anti-reflection layer. The fifth buffer layer 235 may be etched with the first photoresist layer 261. The fifth buffer layer 235 may be in a long-strip shape after being patterned, which is arranged in the second direction and extends in the first direction. The first pattern 2341 is defined after the fifth buffer layer 235 is patterned. Then, the first photoresist layer 161 is removed, and the patterned fifth buffer layer 235 is taken as a mask for etching the second buffer layer 234 to transfer the patterns on the fifth buffer layer 235 onto the second buffer layer 234. The patterned fifth buffer layer 235 may be removed by any process known to those of skill in the art such as wet etching or dry etching. Then, the patterned second buffer layer 234 is taken as a mask for etching the second mask layer 233 to form the first pattern 2341. In other examples, by setting the thickness of the fifth buffer layer 235, the fifth buffer layer 235 is completely consumed while the second buffer layer 234 is kept to be not consumed too much after the fifth buffer layer 235 is taken as the mask for sequentially etching the second buffer layer 234 and the second mask layer 233.

In an example, each of the first mask layer 231, the second mask layer 233, the third mask layer 236 and the fourth mask layer 238 includes an SOH; and each of the first buffer layer 232, the third buffer layer 237 and the fifth buffer layer 235 include a silicon oxynitride layer. Each of the second buffer layer 234 and the fourth buffer layer 239 include a silicon nitride layer, and each of the first mask pattern 2511 and the second mask pattern 2521 includes an oxide pattern. In other examples, each of the first mask layer 231, the second mask layer 233, the third mask layer 236 and the fourth mask layer 238 includes an SOH; and each of the first buffer layer 232, the third buffer layer 237 and the fifth buffer layer 235 include a silicon oxynitride layer. Each of the second buffer layer 234 and the fourth buffer layer 239 include an oxide layer, and each of the first mask pattern 2511 and the second mask pattern 2521 includes a silicon nitride pattern. It is only necessary to ensure that the second buffer layer 234, the fifth buffer layer 235 and the first mask pattern 2511 are respectively different materials.

In an example, the SOH includes an amorphous carbon layer or an amorphous silicon layer, the oxide pattern includes a silicon oxide pattern formed through the ALD process, and the silicon nitride pattern includes a silicon nitride pattern formed through the ALD process.

Figure 8A:
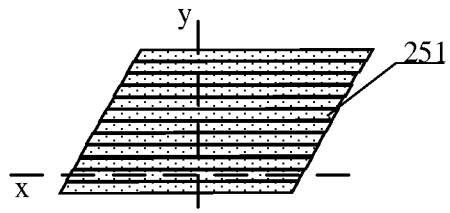
Figure 8B:
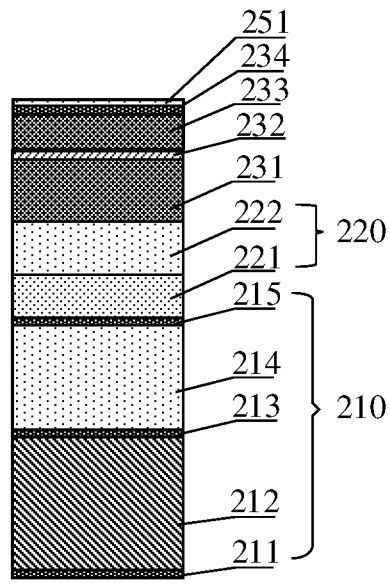
Figure 8C:
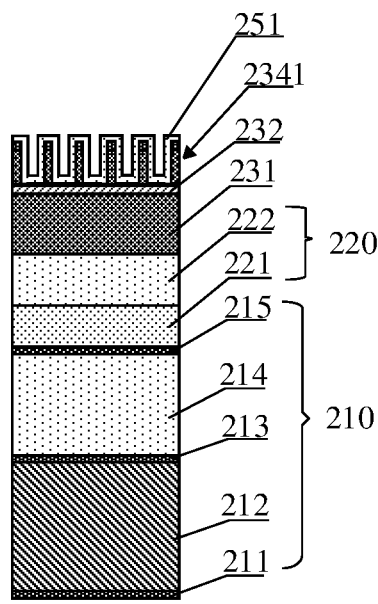
Figure 9A:
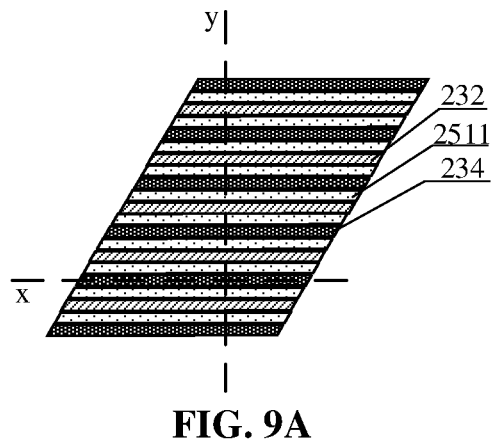
Figure 9B:
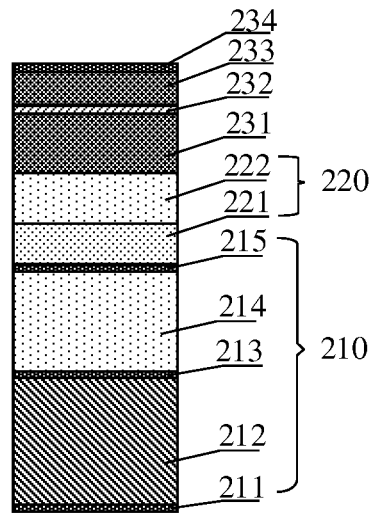
Figure 9C:
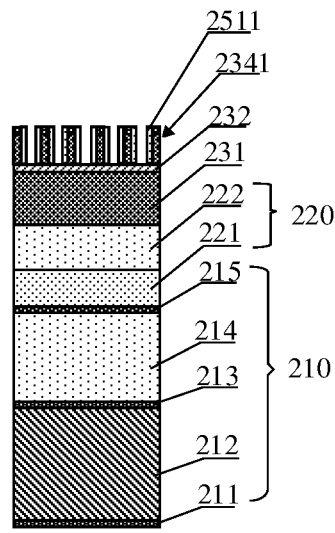

In S160, referring to the operation in S160 of FIG. 5 and FIG. 8A to FIG. 9C (FIG. 8B is a cross-sectional view in an x direction in FIG. 8A, FIG. 8C is a cross-sectional view in a y direction in FIG. 8A, FIG. 9B is a cross-sectional view in a x direction in FIG. 9A, FIG. 9C is a cross-sectional view in a y direction in FIG. 9A, and the x direction is a direction perpendicular to the y direction), the first mask pattern 2511 is formed on a side wall of the first pattern 2341, and the first mask pattern 2511 extends in the first direction.

Specifically, the first mask pattern layer 251 may be firstly formed, and the first mask pattern layer 251 covers the top and the side wall of the first pattern 2341, and covers the portion of the first buffer layer 232 exposed by the first pattern 2341. Only illustratively, the first mask pattern layer 251 may be a silicon nitride material or an oxide material. The first mask pattern layer 251 may be formed through the ALD process. Then, the portion of the first mask pattern layer 251 on the top of the first pattern 2341 and directly covering the surface of the first buffer layer 232 is removed, and only the portion of the first mask pattern layer 251 on the side wall of the first pattern 2341 is retained, so that the first mask pattern 2511 is formed. In the process of removing the portion of the first mask pattern layer 251 on the top of the first pattern 2341 and directly covering the surface of the first buffer layer 232, the upper surface of the second buffer layer 234 may be taken as an etching end point, i.e., when the upper surface of the second buffer layer 234 is exposed, etching on the first mask pattern layer 251 is stopped; and the etching selectivity of the second buffer layer 234 to the first buffer layer 232 is greater than 1, so that the damage to the first buffer layer 232 is smaller. Only illustratively, the first mask pattern 2511 may be in a long-strip shape, which is arranged in the second direction and extends in the first direction. The first pattern 2341 is firstly formed and then the first mask pattern 2511 on the side wall of the first pattern 2341 is formed, so that the spacing between first mask patterns 2511 is smaller than that of first patterns 2341. In such a manner, the requirement on the characteristic dimension of the mask plate may be reduced.

Figure 10A:
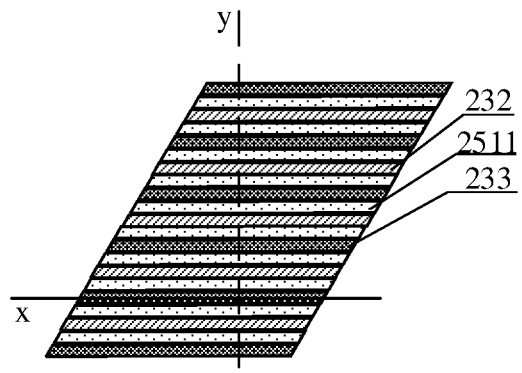
Figure 10B:
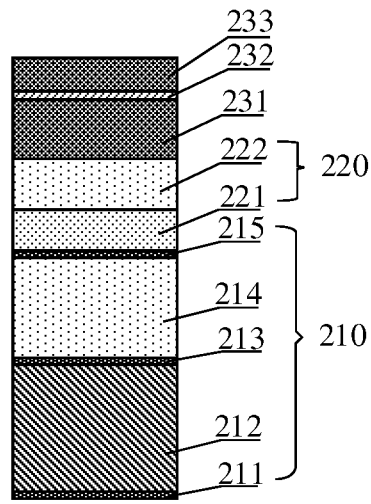
Figure 10C:
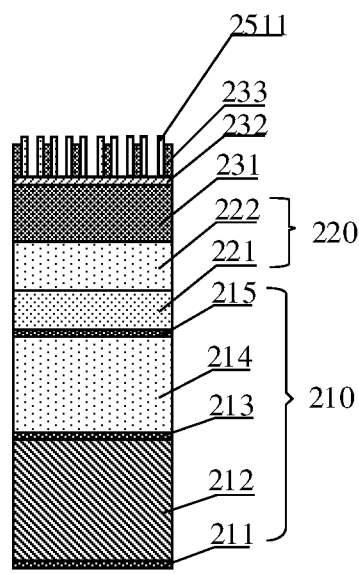
Figure 11A:
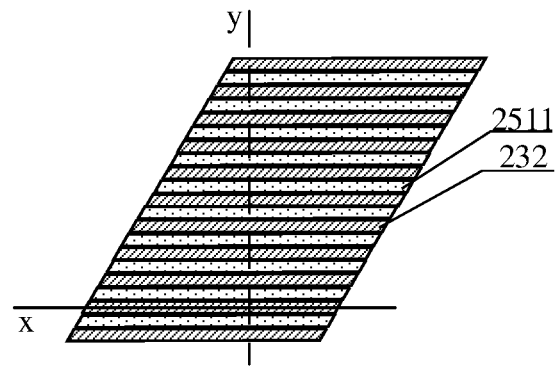
Figure 11B:
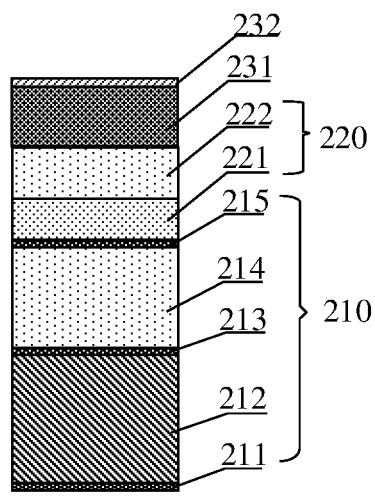
Figure 11C:
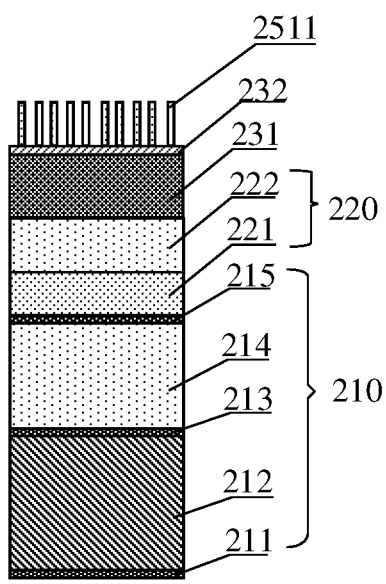

In S180, referring to the operation in S180 of FIG. 5 and FIG. 10A to FIG. 11C (FIG. 10B is a cross-sectional view in an x direction in FIG. 10A, FIG. 10C is a cross-sectional view in a y direction in FIG. 8A, FIG. 11B is a cross-sectional view in a x direction in FIG. 11A, FIG. 11C is a cross-sectional view in a y direction in FIG. 11A, and the x direction is a direction perpendicular to the y direction), the second buffer layer 234 and the second mask layer 233 are removed.

Specifically, the second buffer layer 234 may be removed by wet etching (WET), for example, the second buffer layer 234 may be removed by hot phosphoric acid; and the second buffer layer 234 also may be removed by dry etching, for example, the second buffer layer 234 may be removed by taking CF4, CHF3, O2 and the like as etching gas. The second mask layer 233 may be removed by taking oxygen gas (O$_2$) as main gas.

Figure 12A:
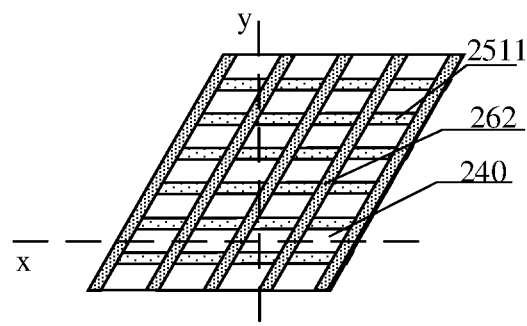
Figure 12B:
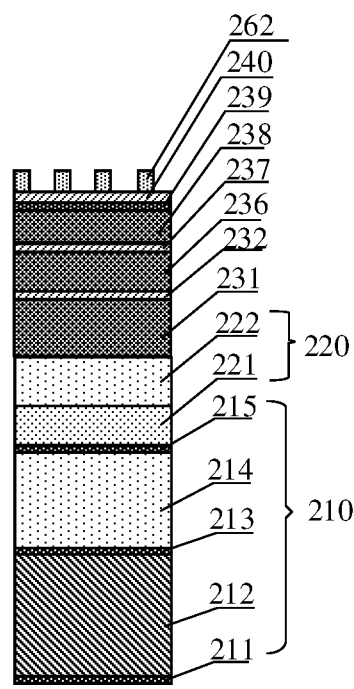
Figure 12C:
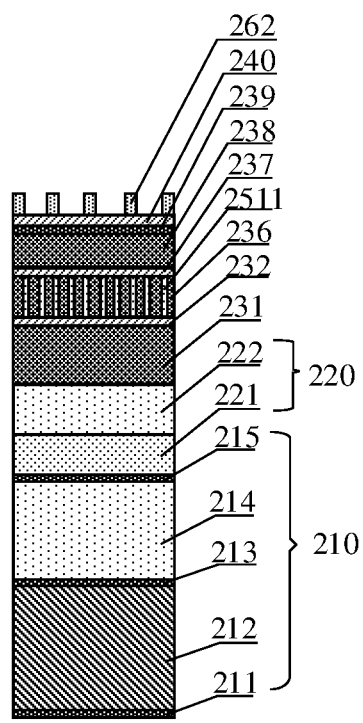

In S200, referring to the operation in S200 of FIG. 5 and FIG. 12A to FIG. 12C (the top view of FIG. 12A shows the first mask pattern 2511, which may not be seen actually from the top view, FIG. 12B is a cross-sectional view in the x direction in FIG. 12A, FIG. 12C is a cross-sectional view in the y direction in FIG. 12A, and the x direction is a direction perpendicular to the y direction), the third mask layer 236, the third buffer layer 237, the fourth mask layer 238 and the fourth mask layer 239 sequentially arranged are formed, the third mask layer 236 covers the first buffer layer 232 and fills up gaps of first mask patterns 2511, an upper surface of the third mask layer 236 is flush with an upper surface of the first mask pattern 2511, and the etching selectivity of the fourth buffer layer 239 to the third buffer layer 237 is greater than 1.

Only illustratively, the third mask layer 236 and the fourth mask layer 238 may include, but are not limited to a SOH. The SOH may include an amorphous carbon layer or an amorphous silicon layer. The third buffer layer 237 may include, but is not limited to a silicon oxynitride layer. The fourth buffer layer 239 may include, but is not limited to a silicon nitride layer or an oxide layer. The oxide layer may include a silicon oxide layer formed by tetraethyl orthosilicate. The etching selectivity of the fourth buffer layer 239 to the third buffer layer 237 is greater than 1, for example, the etching selectivity of the fourth buffer layer 239 to the third buffer layer 237 may be in the range of 10-50.

Specifically, the third mask layer 236, the third buffer layer 237, the fourth mask layer 238 and the fourth buffer layer 239 may be formed through any process known to those of skill in the art. For example, the fourth buffer layer 239 may be formed by depositing silicon nitride or oxide through an ALD process.

Figure 13A:
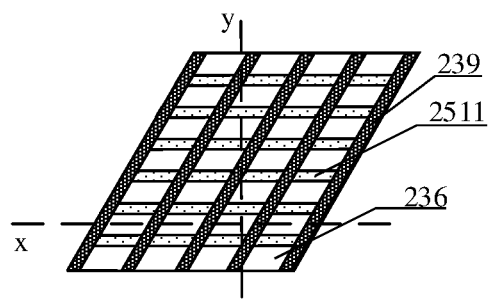
Figure 13B:
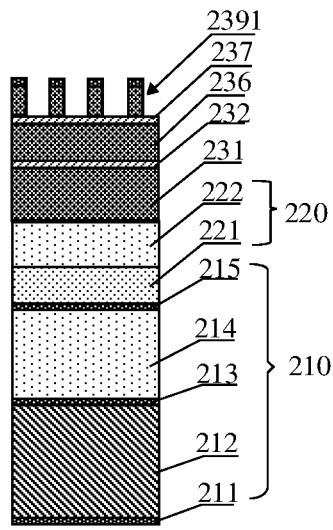
Figure 13C:
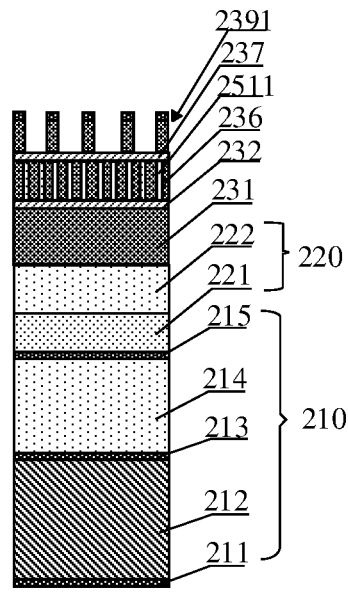

In S220, referring to the operation in S220 of FIG. 5 and FIG. 13A to FIG. 13C (the top view of FIG. 13A shows the first mask pattern 2511, which may not be seen actually from the top view, FIG. 13B is a cross-sectional view in the x direction in FIG. 13A, FIG. 13C is a cross-sectional view in the y direction in FIG. 13A, and the x direction is a direction perpendicular to the y direction), the fourth buffer layer 239 and the fourth mask layer 238 are patterned to form a second pattern 2391.

Specifically, a second photoresist layer 262 may be formed on the fourth buffer layer 239, and the second photoresist layer 262 may be photolithographed with a mask (including, but not limited to the operations of coating, baking, exposing, developing and the like), so that a pattern extending in a second direction is formed on the second photoresist layer 262, and the pattern on the second photoresist layer may define the second pattern 2391. The pattern on the first photoresist layer 262 shown in the embodiment of FIG. 12 includes multiple long-strip-shaped patterns which are arranged in the first direction and extend in the second direction, and spacing among the long-strip-shaped patterns may be set according to practical needs. In other embodiments, the shape of the second pattern 2391 defined by the second photoresist layer 262 also may be other shapes. The fourth buffer layer 239 and the fourth mask layer 238 are sequentially etched based on the pattern on the second photoresist layer 262 to form the second pattern 2391. The second pattern 2391 also may be in a long-strip shape, which is arranged in the first direction and extends in the second direction. The second photoresist layer 262 may be removed after the second pattern 2391 is formed.

In one embodiment, the operation of forming a sixth buffer layer 240 on an upper surface of the fourth buffer layer 239 in S210 is further included before the operation of forming the second pattern 2391 in S220, and the material of the sixth buffer layer 240 may be the same with that of the third buffer layer 237. For example, each of the third buffer layer 237 and the sixth buffer layer 240 may include, but is not limited to, a silicon oxynitride layer. The sixth buffer layer 240 may be formed through any process known to those of skill in the art.

In the embodiment, the operation of patterning the fourth buffer layer 239 and the fourth mask layer 238 to form the second pattern 2391 in S220 includes the operations in S221 to S224.

In S221, the sixth buffer layer 240 is patterned, and the second pattern 2391 is defined by the patterned sixth buffer layer 240.

In S222, the fourth buffer layer 239 is patterned based on the patterned sixth buffer layer 240.

In S223, the patterned sixth buffer layer 240 is removed.

In S224, the fourth mask layer 238 is patterned based on the patterned fourth buffer layer 239 to form the second pattern 2391.

Specifically, the sixth buffer layer 240 may serve as an anti-reflection layer. The sixth buffer layer 240 may be etched with the second photoresist layer 262. The sixth buffer layer 240 may be in a long-strip shape after being patterned, which is arranged in the first direction and extends in the second direction. The second pattern 2391 is defined after the sixth buffer layer 240 is patterned. Then, the patterned sixth buffer layer 240 is taken as a mask for etching the fourth buffer layer 239 to transfer the patterns on the sixth buffer layer 240 onto the fourth buffer layer 239. The patterned sixth buffer layer 240 may be removed by any process known to those of skill in the art such as wet etching or dry etching. Then, the patterned fourth buffer layer 239 is taken as a mask for etching the fourth mask layer 238 to form the second pattern 2391. In other examples, by setting the thickness of the sixth buffer layer 240, the sixth buffer layer 240 is completely consumed while the fourth buffer layer 239 is kept to be not consumed too much after the sixth buffer layer 240 is taken as the mask for sequentially etching the fourth buffer layer 239 and the fourth mask layer 238.

In an example, each of the first mask layer 231, the second mask layer 233, the third mask layer 236 and the fourth mask layer 238 includes an SOH; and each of the first buffer layer 232, the third buffer layer 237 and the sixth buffer layer 240 include a silicon oxynitride layer. Each of the second buffer layer 234 and the fourth buffer layer 239 includes a silicon nitride layer. Both the first mask pattern 2511 and the second mask pattern 2521 include oxide patterns. In other examples, each of the first mask layer 231, the second mask layer 233, the third mask layer 236 and the fourth mask layer 238 includes an SOH; and each of the first buffer layer 232, the third buffer layer 237 and the sixth buffer layer 240 include a silicon oxynitride layer. Both the first mask pattern 2511 and the second mask pattern 2521 include silicon oxide patterns. It is only necessary to ensure that the fourth buffer layer 239, the sixth buffer layer 240 and the second mask pattern 2521 are respectively different materials.

In an example, the SOH includes an amorphous carbon layer or an amorphous silicon layer, the oxide pattern includes a silicon oxide pattern formed through the ALD process, and the silicon nitride pattern includes a silicon nitride pattern formed through the ALD process.

Figure 14A:
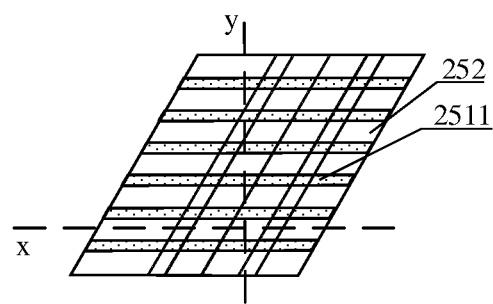
Figure 14B:
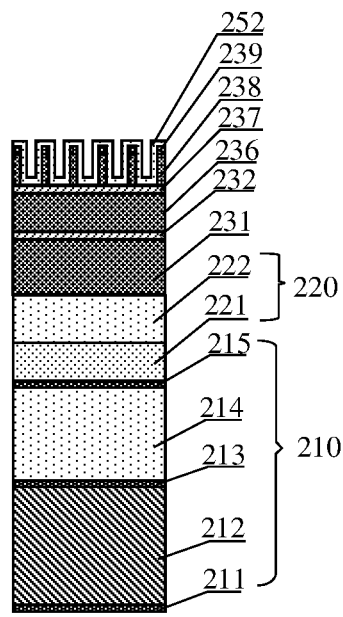
Figure 14C:
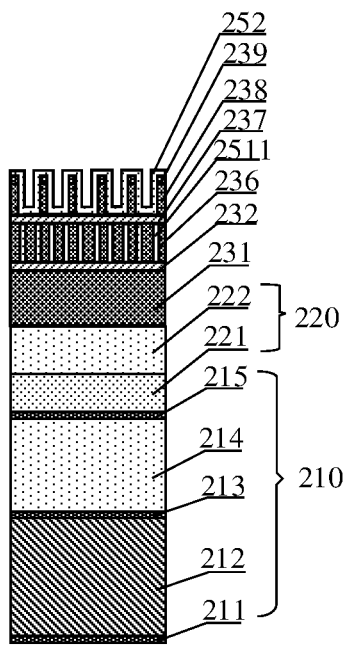

In S240, referring to the operation in S240 of FIG. 5 and FIG. 14A to FIG. 14C (the top view of FIG. 14A shows the first mask pattern 2511, which may not be seen actually from the top view, FIG. 14B is a cross-sectional view in the x direction in FIG. 14A, FIG. 14C is a cross-sectional view in the y direction in FIG. 14A, and the x direction is a direction perpendicular to the y direction), the second mask pattern 2521 is formed on a side wall of the second pattern 2391, the second mask pattern 2521 extends in the second direction, and the second direction is obliquely crossed with the first direction.

Specifically, the second mask pattern layer 252 may be firstly formed, and the second mask pattern layer 252 covers the top and the side wall of the second pattern 2391, and covers the portion of the third buffer layer 237 exposed by the second pattern 2391. Only illustratively, the second mask pattern layer 252 may be a silicon nitride material or an oxide material. The second mask pattern layer 252 may be formed through the ALD process. Then, the portion of the second mask pattern layer 252 on the top of the second pattern 2391 and directly covering the surface of the third buffer layer 237 is removed, and only the portion of the second mask pattern layer 252 on the side wall of the second pattern 2391 is remained, so that the second mask pattern 2521 is formed. In the process of removing the second first mask pattern layer 252 on the top of the first pattern 2391 and directly covering the surface of the third buffer layer 237, the upper surface of the fourth buffer layer 239 may be taken as an etching end point, i.e., when the upper surface of the fourth buffer layer 239 is exposed, etching on the second mask pattern layer 252 is stopped; and the etching selectivity of the fourth buffer layer 239 to the third buffer layer 237 is greater than 1, so that the third buffer layer 237 is not etched. Only illustratively, the second mask pattern 2521 may be in a long-strip shape, which is arranged in the first direction and extends in the second direction. By forming the second pattern 2391 firstly and then forming the second mask pattern 2521 on the side wall of the second pattern 2391, the spacing between second mask patterns 2521 is smaller than that of second patterns 2391. In such a manner, the requirement on the characteristic dimension of the mask plate may be reduced.

Figure 21:
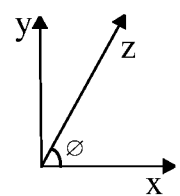
FIG. 21 is a schematic diagram of a first direction and a second direction in a method for manufacturing a semiconductor structure provided in an embodiment of the present disclosure.

Only illustratively, an included angle between the first direction and the second direction ranges from 55 degrees to 65 degrees. The included angle between the first direction and the second direction may be 55 degrees, 60 degrees, 65 degrees and the like. For example, referring to FIG. 21, the first direction may be an x direction, and the second direction may be a z direction, the x direction is perpendicular to the y direction, and an included angle θ between the first direction and the second direction is 60 degrees.

Figure 15A:
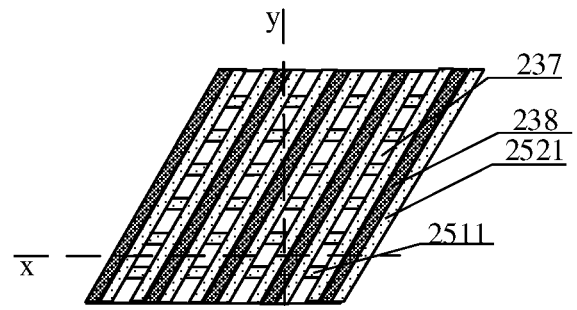
Figure 15B:
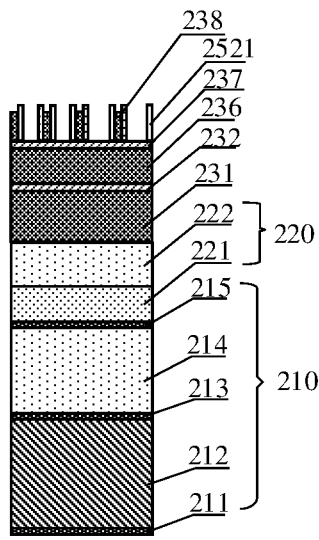
Figure 15C:
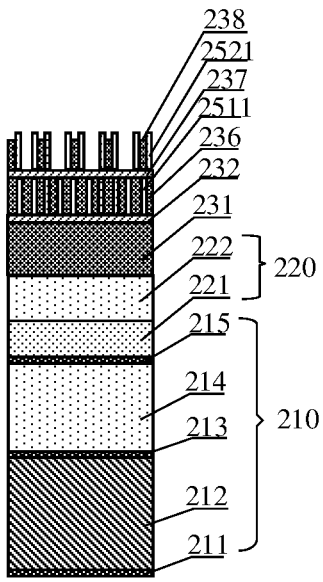
Figure 16A:
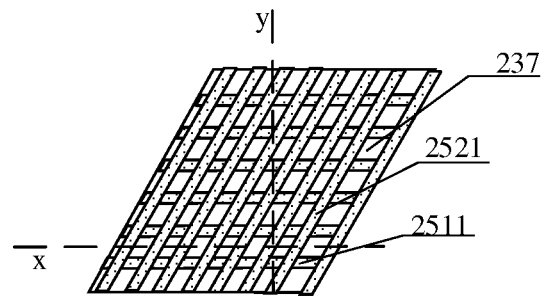
Figure 16B:
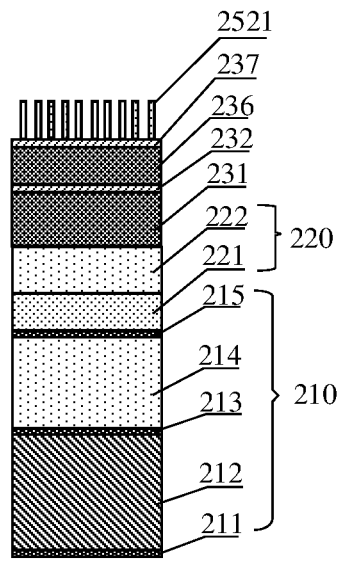
Figure 16C:
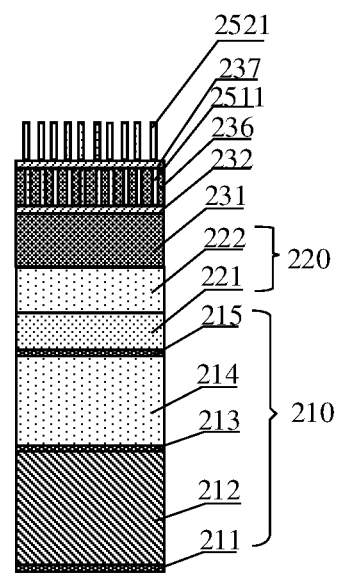

In S260, referring to the operation in S260 of FIG. 5 and FIG. 15A to FIG. 16C (the top view of FIG. 15A and FIG. 16A show the first mask pattern 2511, which may not be seen actually from the top view, FIG. 15B is a cross-sectional view in the x direction in FIG. 15A, FIG. 15C is a cross-sectional view in the y direction in FIG. 15A, FIG. 16B is a cross-sectional view in the x direction in FIG. 16A, FIG. 16C is a cross-sectional view in the y direction in FIG. 16A, and the x direction is a direction perpendicular to the y direction), the fourth buffer layer 239 and the fourth mask layer 238 are removed.

Specifically, the fourth buffer layer 239 may be removed by wet etching. The fourth mask layer 238 may be removed by taking oxygen gas as main gas.

In an example, the operation of forming a target mask layer 220 in S110 is further included before the operation of forming the first mask layer 231, the first buffer layer 232, the second mask layer 233 and the second buffer layer 234 sequentially stacked from bottom to top in S120. The target mask layer 220 is positioned below the first mask layer 231. The material of the target mask layer 220 may be selected according to characteristics of a device to be formed. The target mask layer 220 may be a single-layer structure, and also may be a multi-layer stacked structure. The target mask layer 220 may be formed through any way known to those of skill in the art, for example a thin film growth process, and the like.

Figure 20:
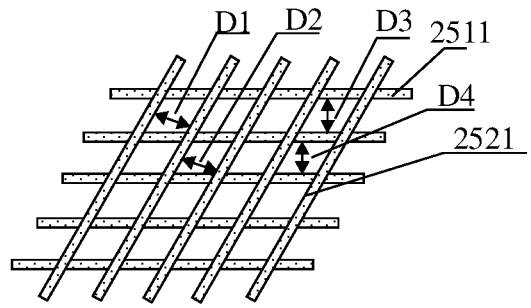
FIG. 20 is a top view of a first mask pattern and a second mask pattern formed in a method for manufacturing a semiconductor structure provided in an embodiment of the present disclosure.

Referring to FIG. 20 (the top view of FIG. 20 merely shows the first mask pattern 2511 and the second mask pattern 2521) and FIG. 16A to FIG. 16C, the first mask pattern 2511 and the second mask pattern 2521 are transferred onto the target mask layer 220. The first mask pattern 2511 extends in the first direction, the second mask pattern 2521 extends in the second direction, and the first direction is obliquely crossed with the second direction, so that holes may be formed in the target mask layer 220. Further, by setting the etching selectivity of the second buffer layer 234 to the first buffer layer 232 to be greater than 1, the first buffer layer 232 may be protected from being etched while the first mask pattern 2511 is formed. By setting the etching selectivity of the fourth buffer layer 239 to the third buffer layer 237 to be greater than 1, the third buffer layer 237 is protected from being etched while the second mask pattern 2521 is formed. The groove width D1 is equal to the groove width D2, and the groove width D3 is equal to the groove width D4, so that the holes formed by obliquely crossing the two patterns are uniform in dimension after the first mask pattern 2511 and the second mask pattern 2521 are transferred onto the target mask layer 220, and the etching holes formed by etching the to-be-etched material with the target mask layer 220 are also consistent in dimension, thereby not influencing the device performance.

In the embodiment, after the operation of removing the fourth buffer layer 239 and the fourth mask layer 238 in S260, the operations in S271 to S274 are further included.

In S271, an exposed portion of the third buffer layer 237 and an exposed portion of the third mask layer 236 are removed based on the second mask pattern 2521.

In S272, the first mask layer 231 and the first buffer layer 232 are patterned based on the first mask pattern 2511 and the second mask pattern 2521.

In S273, the first mask pattern 2511, the second mask pattern 2521, a remaining portion of the third buffer layer 237 and a remaining portion of the third mask layer 236 are removed.

In S274, the target mask layer 220 is patterned based on the patterned first buffer layer 232 and the patterned first mask layer 231 to obtain the patterned mask layer.

Specifically, the second mask pattern 2521 is firstly taken as a mask for etching the exposed portion of third buffer layer 237. Then, the second mask pattern 2521 and the remaining portion of the third buffer layer 237 are taken as a mask for etching the exposed portion of third mask layer 236. In this process, the first mask pattern 2511 is not removed. Then, the first mask pattern 2511, the remaining portion of the third buffer layer 237, the remaining portion of the third mask layer 236 and the second mask pattern 2521 are taken as a mask for sequentially etching the first buffer layer 232 and the first mask layer 231. Then, the first mask pattern 2511, the second mask pattern 2521, the remaining portion of the third buffer layer 237 and the remaining portion of the third mask layer 236 are removed. Then, the remaining portion of the first mask layer 231 and the first buffer layer 232 are taken as a mask for etching the target mask layer 220 to obtain a patterned mask layer.

In the embodiment, the operation of forming the target mask layer 220 in S110 includes the operations in S111 to S112.

In S111, a first target mask layer 221 is formed.

In S112, a second target mask layer 222 is formed on an upper surface of the first target mask layer 221, and the first mask layer 231 is positioned on an upper surface of the second mask layer 222.

Only illustratively, the first target mask layer 221 includes, but is not limited to a polysilicon layer. The second target mask layer 222 includes, but is not limited to an oxide layer. For example, the second target mask layer 222 includes a silicon oxide layer formed by tetraethyl orthosilicate. The first target mask layer 221 and the second target mask layer 222 may be formed through any way known to those of skill in the art.

Figure 17A:
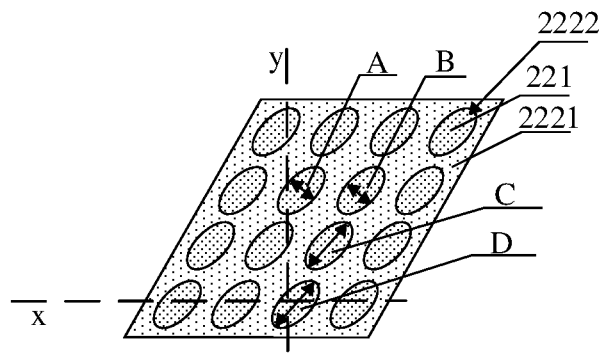
Figure 17B:
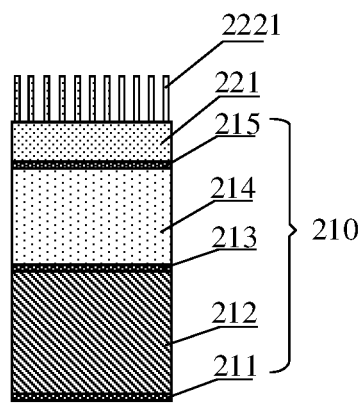
Figure 17C:
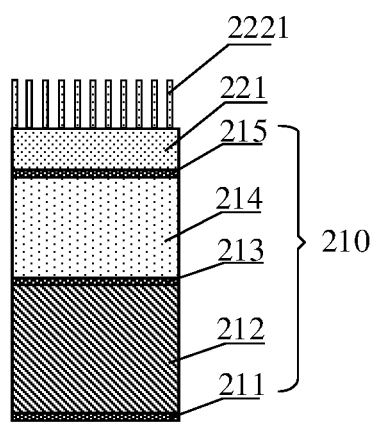
Figure 18A:
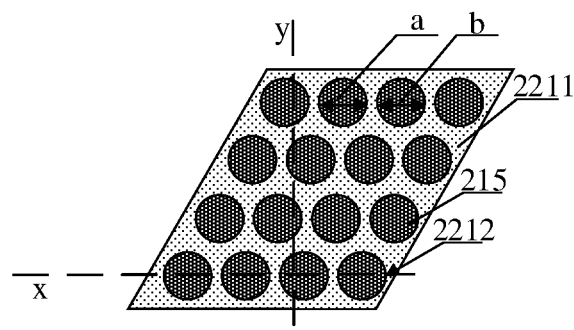
Figure 18B:
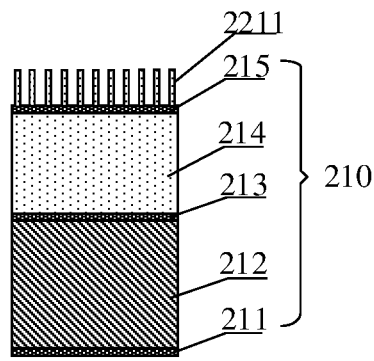
Figure 18C:
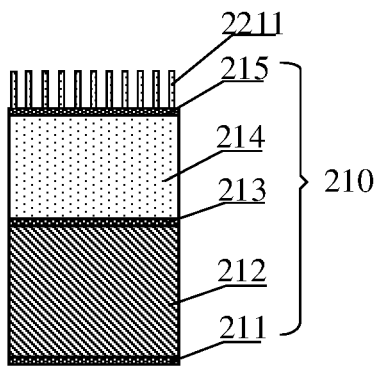

In an embodiment, referring to FIG. 17A to FIG. 18C (FIG. 17B is a cross-sectional view in an x direction in FIG. 17A, FIG. 17C is a cross-sectional view in a y direction in FIG. 17A, FIG. 18B is a cross-sectional view in an x direction in FIG. 18A, FIG.18C is a cross-sectional view in a y direction in FIG. 18A, and the x direction is a direction perpendicular to the y direction), the operation of patterning the target mask layer 220 based on the patterned first buffer layer 232 and the patterned first mask layer 231 to obtain the patterned mask layer in S274 includes the operations in S2741 to S2744.

In S2741, the second target mask layer 222 is patterned based on the patterned first buffer layer 232 and the patterned first mask layer 231 to obtain a second patterned target mask layer 2221.

In S2742, the patterned first buffer layer 232 and the patterned first mask layer 231 are removed.

In S2743, the first target mask layer 221 is patterned based on the second patterned target mask layer 2221 to obtain a first patterned target mask layer 2211.

In S2744, the second patterned target mask layer 2221 is removed.

Specifically, the patterned first buffer layer 232 and the patterned first mask layer 231 are taken as a mask for etching the second target mask layer 222 to obtain the second patterned target mask layer 2221. Second target mask layer openings 2222 which are consistent in dimension and are uniform in distribution are formed in the second patterned target mask layer 2221, and the second target mask layer openings 2222 are arranged in an array. For example, multiple oval openings arranged in an array may be formed in the second patterned target mask layer 2221, a width of each oval opening is the same in the same direction. Referring to FIG. 17A, short axes A and B of the oval openings are equal, and long axes C and D of the oval openings are equal. Then, the patterned first buffer layer 232 and the patterned first mask layer 231 are removed. Then, the second patterned target mask layer 2221 is taken as a mask for etching the first target mask layer 221 to obtain the first patterned target mask layer 2211, and the second patterned target mask layer 2221 is removed. First target mask layer openings 2212 which are consistent in dimension and are uniform in distribution are formed in the first patterned target mask layer 2211, and the first target mask layer openings 2212 may be arranged in an array. For example, multiple circular openings arranged in an array may be formed in the first patterned target mask layer 2211, the diameter of each circular opening is the same. Referring to FIG. 18A, the diameters a and b of the circular openings are equal.

In an embodiment, the operation of removing the patterned first buffer layer 232 and the patterned first mask layer 231 in S275 is further included after the operation of forming the patterned mask layer in S274.

In an embodiment, the operation of forming a stacked structure 210 including a supporting layer and a sacrificial layer sequential stacked in an alternating manner in S100 is further included before the operation of forming the target mask layer 220 in S110. The operation of etching the stacked layer 210 based on the patterned mask layer to form a capacitor hole in the stacked layer 210 in S276 is further included after the operation of obtaining the patterned mask layer in S274.

Figure 19A:
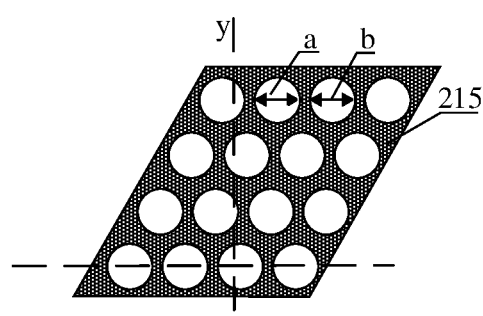
Figure 19B:
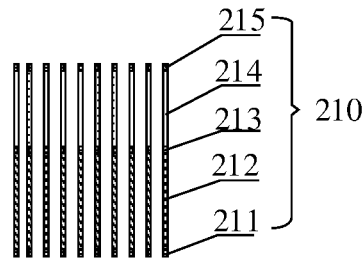
Figure 19C:
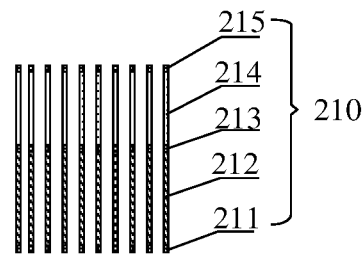

Specifically, the stacked layer 210 is the to-be-etched material. Referring to FIG. 19, the patterned mask layer is taken as a mask for etching the stacked structure 210 to form a capacitor hole in the stacked structure 210. Then, a capacitor material is filled up in the capacitor hole to form an array capacitor. In other embodiments, an etching hole formed by etching in the stacked structure 210 also may be taken as a containing space for placing the rest of device in an integrated circuit.

In an embodiment, the operation of forming the stacked structure 210 including the supporting layer and the sacrificial layer sequential stacked in an alternating manner in S100 includes the operations in S101 to S105.

In S101, a bottom supporting layer 211 is formed.

In S102, a first sacrificial layer 212 is formed on an upper surface of the bottom supporting layer 211.

In S103, a middle supporting layer 213 is formed on an upper surface of the first sacrificial layer 212.

In S104, a second sacrificial layer 214 is formed on an upper surface of the middle supporting layer 213.

In S105, a top supporting layer 215 is formed on an upper surface of the second sacrificial layer 214.

Only illustratively, each of the bottom supporting layer 211, the middle supporting layer 213 and the top supporting layer 215 includes, but is not limited to a silicon nitride layer. The first sacrificial layer 212 includes, but is not limited to an oxide layer. For example, the first sacrificial layer 212 may include a Born-Phospho-Silicate Glass (BPSG) layer. The second sacrificial layer 214 includes, but is not limited to an oxide layer. For example, the second sacrificial layer 214 may include a silicon oxide layer formed by Tetraethyl Orthosilicate (TEOS). The bottom supporting layer 211, the first sacrificial layer 212, the middle supporting layer 213, the second sacrificial layer 214 and the top supporting layer 215 sequentially stacked may be formed through any process known to those of skill in the art. When the stacked structure 210 is etched, the first patterned target mask layer 2211 is taken as a mask for sequentially etching the top supporting layer 215, the second sacrificial layer 214, the middle supporting layer 213, the first sacrificial layer 212 and the bottom supporting layer 211 to form etching holes as capacitor holes, each capacitor hole is the same in dimension. When the capacitor holes are circular capacitor holes, the diameters of the capacitor holes are equal.

It should be understood that, although the various operations in the flowchart of FIG. 5 are displayed in sequence as indicated by the arrows, these operations are not necessarily executed in sequence as indicated by the arrows. Unless specifically stated herein, there are no strict sequential restrictions on the execution of these operations, and these operations can be executed in other orders. Moreover, at least part of the operations in FIG. 5 may include multiple operations or multiple stages. These operations or stages are not necessarily executed at the same moment, but can be executed at different moments. The operations or stages are not necessarily executed sequentially, but may be executed successively or alternately with other operations or at least some of operations or stages in other operations.

The various technical features of the above embodiments may be combined in any suitable manner. For simple description, all possible combinations of the various technical features of the embodiments have not been described.

However, the combinations of these technical features should be considered as a scope of the specification as long as there is no contradiction in the combination of these technical features.

The above embodiments merely describe several embodiments of the present disclosure, which are described in more detail, but are not to be construed as a limitation to the scope of the patent disclosure. It is to be noted that several variations and modifications may also be made by those skilled in the art without departing from the spirit of the present disclosure, which all fall within the protection scope of the present disclosure. Therefore, the protection scope of the present disclosure shall be subjected to the appended claims.

The invention claimed is:

1. A method for manufacturing a semiconductor structure, comprising:
  forming a first mask layer, a first buffer layer, a second mask layer and a second buffer layer sequentially stacked from bottom to top, wherein an etching selectivity of the second buffer layer to the first buffer layer is greater than 1;
  patterning the second buffer layer and the second mask layer to form a first pattern;
  forming a first mask pattern on a side wall of the first pattern, the first mask pattern extending in a first direction;
  removing the second buffer layer and the second mask layer;
  forming a third mask layer, a third buffer layer, a fourth mask layer and a fourth buffer layer sequentially stacked from bottom to top, wherein the third mask layer covers the first buffer layer and fills up gaps in the first mask pattern, an upper surface of the third mask layer is flush with an upper surface of the first mask pattern, and an etching selectivity of the fourth buffer layer to the third buffer layer is greater than 1;
  patterning the fourth buffer layer and the fourth mask layer to form a second pattern;
  forming a second mask pattern on a side wall of the second pattern, the second mask pattern extending in a second direction, and the second direction being obliquely crossed with the first direction; and
  removing the fourth buffer layer and the fourth mask layer;
  wherein before the first pattern is formed, the method further comprises: forming a fifth buffer layer on an upper surface of the second buffer layer, wherein a material of the fifth buffer layer is the same as that of the first buffer layer;
  wherein patterning the second buffer layer and the second mask layer to form the first pattern comprises:
    patterning the fifth buffer layer, wherein the first pattern is defined by a patterned fifth buffer layer;
    patterning the second buffer layer based on the patterned fifth buffer layer to forming a patterned second buffer layer;
    removing the patterned fifth buffer layer; and
    patterning the second mask layer based on the patterned second buffer layer to form the first pattern.

2. The method of claim 1, wherein before the second pattern is formed, the method further comprises: forming a sixth buffer layer on an upper surface of the fourth buffer layer, wherein a material of the sixth buffer layer is the same as that of the third buffer layer;
  wherein patterning the fourth buffer layer and the fourth mask layer to form the second pattern comprises:
    patterning the sixth buffer layer, wherein the second pattern is defined by a patterned sixth buffer layer;
    patterning the fourth buffer layer based on the patterned sixth buffer layer to form a patterned fourth buffer layer;
    removing the patterned sixth buffer layer; and
    patterning the fourth mask layer based on the patterned fourth buffer layer to form the second pattern.

3. The method of claim 2, wherein each of the first mask layer, the second mask layer, the third mask layer and the fourth mask layer comprises a Spin-on Hardmask, and each of the first buffer layer, the third buffer layer and the sixth buffer layer comprises a silicon oxynitride layer;
  each of the second buffer layer and the fourth buffer layer comprises a silicon nitride layer, and each of the first mask pattern and the second mask pattern comprises an oxide pattern; or each of the second buffer layer and the fourth buffer layer comprises an oxide layer, and each of the first mask pattern and the second mask pattern comprises a silicon nitride pattern.

4. The method of claim 1, wherein each of the first mask layer, the second mask layer, the third mask layer and the fourth mask layer comprises a Spin-on Hardmask, and each of the first buffer layer, the third buffer layer and the fifth buffer layer comprises a silicon oxynitride layer;
  each of the second buffer layer and the fourth buffer layer comprises a silicon nitride layer, and each of the first mask pattern and the second mask pattern comprises an oxide pattern; or each of the second buffer layer and the fourth buffer layer comprises an oxide layer, and each of the first mask pattern and the second mask pattern comprises a silicon nitride pattern.

5. The method of claim 4, wherein the Spin-on Hardmask comprises an amorphous carbon layer or an amorphous silicon layer, the oxide pattern comprises a silicon oxide pattern formed through an atomic layer deposition (ALD) process, and the silicon nitride pattern comprises a silicon nitride pattern formed through the ALD process.

6. The method of claim 1, wherein an included angle between the first direction and the second direction ranges from 55 degrees to 65 degrees.

7. The method of claim 1, wherein before forming the first mask layer, the first buffer layer, the second mask layer and the second buffer layer sequentially stacked from bottom to top, the method further comprises:
  forming a target mask layer, the target mask layer being positioned below the first mask layer;
  after removing the fourth buffer layer and the fourth mask layer, the method further comprises:
    removing an exposed portion of the third buffer layer and an exposed portion of the third mask layer based on the second mask pattern;
    patterning the first mask layer and the first buffer layer based on the first mask pattern and the second mask pattern to form a patterned first mask layer and a patterned first buffer layer;
    removing the first mask pattern, the second mask pattern, a remaining portion of the third buffer layer and a remaining portion of the third mask layer; and
  patterning the target mask layer based on the patterned first buffer layer and the patterned first mask layer to obtain a patterned mask layer.

8. The method of claim 7, wherein after the patterned mask layer is formed, the method further comprises:
  removing the patterned first buffer layer and the patterned first mask layer.

9. The method of claim 7, wherein forming the target mask layer comprises:
   forming a first target mask layer; and
   forming a second target mask layer on an upper surface of the first target mask layer, the first mask layer being positioned on an upper surface of the second target mask layer.

10. The method of claim 9, wherein patterning the target mask layer based on the patterned first buffer layer and the patterned first mask layer to obtain the patterned mask layer comprises:
   patterning the second target mask layer based on the patterned first buffer layer and the patterned first mask layer to obtain a second patterned target mask layer;
   removing the patterned first buffer layer and the patterned first mask layer;
   patterning the first target mask layer based on the second patterned target mask layer to obtain a first patterned target mask layer; and
   removing the second patterned target mask layer.

11. The method of claim 10, wherein a plurality of oval openings arranged in an array are formed in the second patterned target mask layer, a width of each of the plurality of oval openings being the same in a same direction, and a plurality of circular openings arranged in an array are formed in the first patterned target mask layer, a diameter of each of the plurality of circular openings being the same.

12. The method of claim 9, wherein the second target mask layer comprises an oxide layer, and the first target mask layer comprises a polysilicon layer.

13. The method of claim 12, wherein the second target mask layer comprises a silicon oxide layer formed by tetraethyl orthosilicate.

14. The method of claim 7, wherein before forming the target mask layer, the method further comprises:
   forming a stacked structure comprising a supporting layer and a sacrificial layer sequentially stacked in an alternating manner;
   after the patterned mask layer is obtained, the method further comprises:
      etching the stacked structure based on the patterned mask layer to form a capacitor hole in the stacked structure.

15. The method of claim 14, wherein forming the stacked structure comprising the supporting layer and the sacrificial layer sequentially stacked in an alternating manner comprises:
   forming a bottom supporting layer;
   forming a first sacrificial layer on an upper surface of the bottom supporting layer;
   forming a middle supporting layer on an upper surface of the first sacrificial layer;
   forming a second sacrificial layer on an upper surface of the middle supporting layer; and
   forming a top supporting layer on an upper surface of the second sacrificial layer.

16. The method of claim 15, wherein each of the bottom supporting layer, the middle supporting layer and the top supporting layer comprises a silicon nitride layer, the first sacrificial layer comprises a boro-phospho-silicate glass layer, and the second sacrificial layer comprises a silicon oxide layer formed by tetraethyl orthosilicate.

17. The method of claim 1, wherein before the first pattern is formed, the method further comprises:
   forming a first photoresist layer on the second buffer layer; and
   sequentially performing etching on the second buffer layer and the second mask layer based on a pattern on the first photoresist layer to form the first pattern.

18. The method of claim 17, further comprising:
   removing the first photoresist layer after the first pattern is formed.

19. The method of claim 1, wherein before the first pattern is formed, the method further comprises:
   forming a first photoresist layer on the second buffer layer; and
   performing etching on the fifth buffer layer with the first photoresist layer to pattern the fifth buffer layer.

* * * * *